(12) United States Patent
Suzuki

(10) Patent No.: US 12,556,177 B2
(45) Date of Patent: Feb. 17, 2026

(54) POWER SWITCH CIRCUIT

(71) Applicant: APPLE INC., Cupertino, CA (US)

(72) Inventor: Shingo Suzuki, San Jose, CA (US)

(73) Assignee: APPLE INC., Cupertino, CA (US)

( * ) Notice: Subject to any disclaimer, the term of this patent is extended or adjusted under 35 U.S.C. 154(b) by 63 days.

(21) Appl. No.: 18/423,477

(22) Filed: Jan. 26, 2024

(65) Prior Publication Data

US 2025/0247091 A1    Jul. 31, 2025

(51) Int. Cl.
H03K 17/16    (2006.01)
H03K 19/0185  (2006.01)

(52) U.S. Cl.
CPC ... *H03K 17/162* (2013.01); *H03K 19/018521* (2013.01)

(58) Field of Classification Search
CPC ..... H03K 17/16; H03K 17/161; H03K 17/162
USPC .................................. 327/108–112
See application file for complete search history.

(56) References Cited

U.S. PATENT DOCUMENTS

| 5,821,769 | A  | 10/1998 | Douseki |
| 6,952,113 | B2 | 10/2005 | Brown et al. |
| 6,956,398 | B1 | 10/2005 | Mair et al. |
| 7,042,274 | B2 | 5/2006  | Hazucha et al. |
| 7,256,608 | B2 | 8/2007  | Ranganathan et al. |
| 7,279,956 | B2 | 10/2007 | Caplan et al. |
| 7,355,440 | B1 | 4/2008  | Santurkar et al. |
| 7,705,625 | B2 | 4/2010  | Yoo et al. |
| 9,531,194 | B2 | 12/2016 | Manohar et al. |
| 10,158,354 | B2 | 12/2018 | Dutta et al. |
| 10,262,985 | B2 | 4/2019  | Robins et al. |
| 10,454,476 | B2 | 10/2019 | Bang et al. |
| 10,659,045 | B2 | 5/2020  | Elsayed |
| 2005/0040881 | A1 | 2/2005 | Brown et al. |
| 2005/0068015 | A1 | 3/2005 | Hazucha et al. |
| 2005/0212554 | A1 | 9/2005 | Mair et al. |
| 2006/0006929 | A1 | 1/2006 | Caplan et al. |
| 2007/0007996 | A1 | 1/2007 | Ranganathan et al. |
| 2007/0063763 | A1 | 3/2007 | Yoo et al. |
| 2013/0099570 | A1 | 4/2013 | Manohar et al. |

(Continued)

FOREIGN PATENT DOCUMENTS

EP    1743422 B1    8/2019

OTHER PUBLICATIONS

Bang, Suyoung, et al. "Reconfigurable sleep transistor for GIDL reduction in ultra-low standby power systems." Proceedings of the IEEE 2012 Custom Integrated Circuits Conference. IEEE, 2012. https://ieeexplore.ieee.org/abstract/document/6330628/.

(Continued)

*Primary Examiner* — Tomi Skibinski
(74) *Attorney, Agent, or Firm* — DICKINSON WRIGHT RLLP

(57) ABSTRACT

A switch circuit includes a first field-effect transistor (FET) having a first gate, a first source, and a first drain, and a second FET having a second gate, a second source, and a second drain. The switch circuit also includes a gate circuit coupled to the first gate and the second gate. The gate circuit is configured to receive a first voltage having a first voltage level and provide a second voltage having a second voltage level to the second gate based on the first voltage. The second voltage level is different from the first voltage level based on an activation state of the switch circuit.

20 Claims, 9 Drawing Sheets

(56) References Cited

U.S. PATENT DOCUMENTS

| | | |
|---|---|---|
| 2017/0330874 A1 | 11/2017 | Robins et al. |
| 2018/0234089 A1* | 8/2018 | Dutta .................. H03K 17/161 |
| 2018/0375507 A1 | 12/2018 | Elsayed |
| 2019/0044512 A1 | 2/2019 | Bang et al. |

OTHER PUBLICATIONS

Bang, Suyoung. Circuit Techniques for Power Management Unit and Switched Capacitor DC-DC Converter. Diss. 2016.https://deepblue.lib.umich.edu/handle/2027.42/120761.

* cited by examiner

POWER SWITCH CIRCUIT

BACKGROUND

Technical Field

Embodiments described herein relate to integrated circuits, and more particularly, to a switch circuit and techniques for operating a switch circuit.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY

Various embodiments of a switch circuit are disclosed. The switch circuit may use the gate circuit to reduce gate-induced drain leakage in the switch circuit. The switch circuit includes a first field-effect transistor (FET) having a first gate, a first source, and a first drain and a second FET comprising a second gate, a second source, and a second drain. The switch circuit also includes a gate circuit coupled to the first gate and the second gate, the gate circuit configured to receive a first voltage and a second voltage to the second gate. The second voltage is different from the first voltage based on whether the switch circuit is in an on state/condition or an off state/condition.

BRIEF DESCRIPTION OF THE DRAWINGS

The following detailed description makes reference to the accompanying drawings, which are now briefly described.

Figure 1:
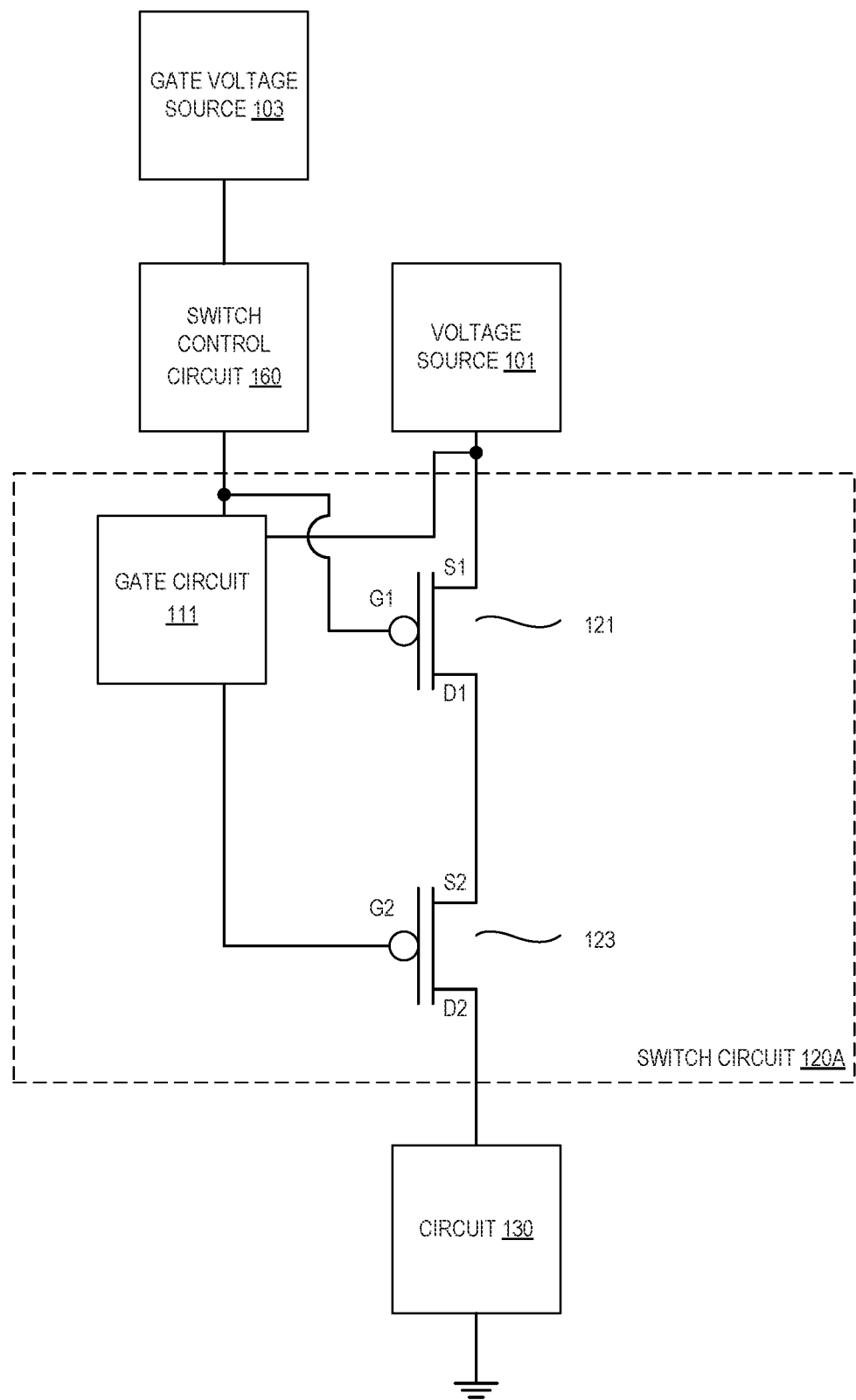
FIG. 1 illustrates a block diagram of an example switch circuit, in accordance with one or more embodiments of the present disclosure.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ a regulator circuit that includes both passive circuit elements (e.g., inductors, capacitors, etc.) as well as active circuit elements (e.g., transistors, diodes, etc.).

A switch circuit (e.g., a circuit that includes one or more switches) may be used to provide current or power to various devices, circuits, etc. For example, a switch circuit may be turned on to provide current to a device, or may be turned off to prevent current from flowing to a device (e.g., to cut/shut off the flow of current). Switch circuits may be included as part of a power converter circuit, or may be coupled between a power converter circuit and another device/circuit that uses the current generated by the power converter circuit.

Although a switch circuit may be turned off, an amount of current may still leak through the switch circuit. This may increase the power consumption of an electronic/computing device and may result in less efficient operation of the electronic/computing device. An overdrive voltage may be provided to the gates of the switches in the switch circuit to reduce the leakage of current. However, this overdrive voltage may result in gate-induced drain leakage.

The embodiments illustrated in the drawings and described below may provide techniques for operating a switch circuit. For example, the switch circuit may use an overdrive voltage to reduce current leakage and may use different overdrive voltages on different switches to reduce gate-induced drain leakage. Reducing the leakage of current through the switch circuit may allow for more efficient operation of an electronic/computing device and/or less power consumption.

FIG. 1 illustrates a block diagram of an example switch circuit 120A, in accordance with one or more embodiments of the present disclosure. Switch circuits (e.g., circuits that include switches which allow voltages/current to flow through the switches) may be accomplished using a variety of circuit designs. As illustrated, switch circuit 120A includes gate circuit 111, FET 121, and FET 123. The switch circuit 120A may be in various states/conditions, such as an on state/condition (where current/power flows through the switch circuit 120A) and an off state/condition (where current/power does not flow through the switch circuit 120A). The state/condition of the switch circuit 120 may also be referred to as an activation state.

The switch circuit 120A is coupled to a voltage source 101, a switch control circuit 160, and a circuit 130. The switch control circuit 160 is coupled to a gate voltage source 103. The switch circuit 120A provides power from the voltage source 101 to the circuit 130. For example, the voltage source 101 may supply power (e.g., current and/or voltage) to the circuit 130 via FETs 121 and 123. The circuit 130 may use the power to operate. For example, the circuit 130 may use the power to perform various functions, to power different portions of the circuit 130, etc. The circuit 130 may be referred to as an external circuit because the circuit 130 is external to switch circuit 120A.

The gate voltage source 103 may provide a voltage to the switch control circuit 160. The switch control circuit 160 may use that voltage to provide one or more voltages to the gates G1 and/or G2 (of FETs 121 and/or 123) via gate circuit 111, as discussed in more detail below. The gate circuit 111 may use a voltage from the voltage source 101 and/or voltage source 101 to operate, as discussed in more detail below.

Although voltage source 101 and gate voltage source 103 are illustrated in FIG. 1 as being separate from the switch circuit 120A, one or more of voltage source 101 and gate voltage source 103 may be part of the switch circuit 120A in other embodiments.

The source S1 of FET 121 is coupled to the voltage source 101. The drain D1 of FET 121 is coupled to the source S2 of FET 123. The drain D2 is coupled to the circuit 130. FETs 121 and 123 may be referred to as a stack, a FET stack, stacked FETs, etc., because they are connected in series. The FETs 121 and 123 may provide a current from the voltage source 101 to the circuit 130 (e.g., current from the voltage source 101 may flow through FET 121 to FET 123, and then to circuit 130). In one embodiment, the FETs 121 and 123 may be referred to as a header stack, a header, etc., because the FETs 121 and 123 are located between voltage source 101 and circuit 130 (e.g., the power from voltage source 101 passes through FETs 121 and 123 before reaching circuit 130).

The FETs 121 and 123 may each have a threshold voltage level. The threshold voltage level of a FET may refer to the minimum voltage level of a voltage that should be applied to change the state of the FET. For example, the FET 121 may be a p-channel MOSFET (e.g., a pFET, a pMOSFET, etc.) and the threshold voltage level of the FET 121 may be the minimum voltage level of a voltage that should be applied to the gate G1 to stop current from flowing through the FET. In another example, the FET 121 may be a n-channel MOSFET (e.g., a nFET, a nMOSFET, etc.) and the threshold voltage of the FET 121 may be the minimum voltage level of a voltage that should be applied to the gate G1 to allow current to flow through the FET. The voltage threshold may also be referred to as a threshold voltage, a threshold voltage level, etc.

In one embodiment, the voltage threshold of the FET 121 may be higher than the voltage threshold of FET 123. For example, the FET 121 may be a standard voltage threshold (SVT) FET and FET 123 may be a low voltage threshold (LVT) FET. In another example, FET 121 may be a LVT FET and FET 123 may be an ultra-low voltage threshold (ULVT) FET. In a further example, FET 121 may be an SVT FET and FET 123 may be a ULVT FET.

In one embodiment, the switch circuit 120A may be in an off state/condition. For example, the FETs 121 and 123 may be turned off to prevent power (e.g., current) from flowing to the circuit 130. However, some current may still leak through FETs 121 and 123 to the circuit 130. For example, even if FETs 121 and 123 are turned off, a certain amount of current may leak through FETs 121 and 123. The current that leaks through the FETs 121 and 123 may increase the power that is used by a circuit 130 and/or by a device that includes the circuit 130 (e.g., a computing/electronic device). This may result in more power consumption by the circuit 130 and/or less efficient operation of the circuit 130 (and/or computing/electronic device that includes circuit 130).

The leakage of current through FETs 121 and 123 may be reduced by applying a voltage with a high/higher voltage level at the gates G1 and G2 of the FETs 121 and 123. For example, the current leakage may be reduced by applying a voltage level higher than the voltage level provided by voltage source 101. The higher voltage level may be referred to as an overdrive voltage, an overdrive voltage level, etc. Although applying a higher voltage level at the gates G1 and G2 (of the FETs 121 and 123 respectively) may reduce the leakage of current from the voltage source 101, this may cause current to leak through the drain D1 and/or through the drain D2. This may be referred to as gate-induced drain leakage (GIDL). The gate-induced drain leakage may also result in more power consumption by the circuit 130 and/or less efficient operation of the circuit 130 (and/or computing/electronic device that includes circuit 130).

The gate circuit 111 may receive a voltage from voltage source 101 at a particular voltage level determined by settings of voltage source 101. The gate circuit 111 may also receive a voltage from voltage source 101, as discussed below. The gate circuit 111 may use the voltage from the voltage source 101 (and a voltage from gate voltage source 103, as discussed below) to operate. For example, portions of the gate circuit 111 may use the voltage from the voltage source 101. The gate circuit 111 may receive a voltage from gate voltage source 103. The gate G1 (of FET 121) may also receive the voltage from the gate voltage source 103. The voltage level at the gate G1 (e.g., the gate voltage of G1) may be referred to as V1. The gate circuit 111 may also provide another voltage (based on the voltage received from the gate voltage source 103) to gate G2 (of FET 123). The voltage level at gate G2 (e.g., the gate voltage of G2) may be referred to as V2.

In one embodiment, the gate circuit 111 may lower the voltage level that is provided to the gate G2 when the switch circuit 120A is in the off state/condition. Thus, the voltage level V2 may be lower than the voltage level V1 (e.g., V1>V2 or V2<V1). Providing a second voltage with a lower voltage level (e.g., V2) to the gate G2 of FET 123 and a first voltage with a higher voltage level (e.g., V1) to the gate G1 of FET 121 may reduce the amount of gate-induced drain leakage (e.g., may reduce the amount of current that leaks through FETs 121 and 123). Providing a higher voltage level to the gate G1 and a lower voltage level to gate G2, may raise/increase the voltage level at drain D1 (which may be referred to as a drain voltage) and may lower/decrease the voltage level at gate G2. This may also be referred to as floating the FET 121. Floating the FET 121 may decrease the amount of gate-induced drain leakage in the switch circuit 120A.

In one embodiment, the switch circuit 120A may be in an on state/condition. For example, the FETs 121 and 123 may be turned on to allow current to flow to the circuit 130. When the switch circuit 120A is in the on state/condition, the gate circuit 111 may not affect or may have little effect on the flow of the current to the circuit 130.

In one embodiment, the switch control circuit 160 may control the operation of the switch circuit 120A (e.g., control operation of the gate circuit 111). For example, when switch circuit 120A is in the off condition/state, the switch control circuit 160 may provide a first voltage with a higher voltage level (e.g., a higher or positive voltage) to the gate circuit 111. The gate circuit 111 may lower the voltage level of the first voltage (e.g., the first voltage level) to provide a second voltage with a second voltage level (e.g., a lower voltage level) to the gate G2 of FET 123. This may reduce the amount of gate-induced drain leakage, as discussed above. In another example, when switch circuit 120B is in the on condition/state, the switch control circuit 160 may provide a third voltage (e.g., a zero or near zero voltage) to the gate circuit 111.

In one embodiment, the switch control circuit 160 may control the operation of the switch circuit 120A based on signals and/or instructions received from another device/circuit. For example, another device (e.g., another control circuit) may provide a signal to switch control circuit 160 indicating that the switch circuit 120A should be turned off (e.g., a sleep signal, an off signal, a control signal, etc.). The switch control circuit 160 may provide different voltages (with different voltage levels) to gate circuit 111 (which may turn on/off the FETs 121 and 123), based on the signal. Although the switch control circuit 160 is illustrated as separate from the switch circuit 120A, the switch control circuit 160 may be part of the switch circuit 120A in other embodiments.

Figure 2:
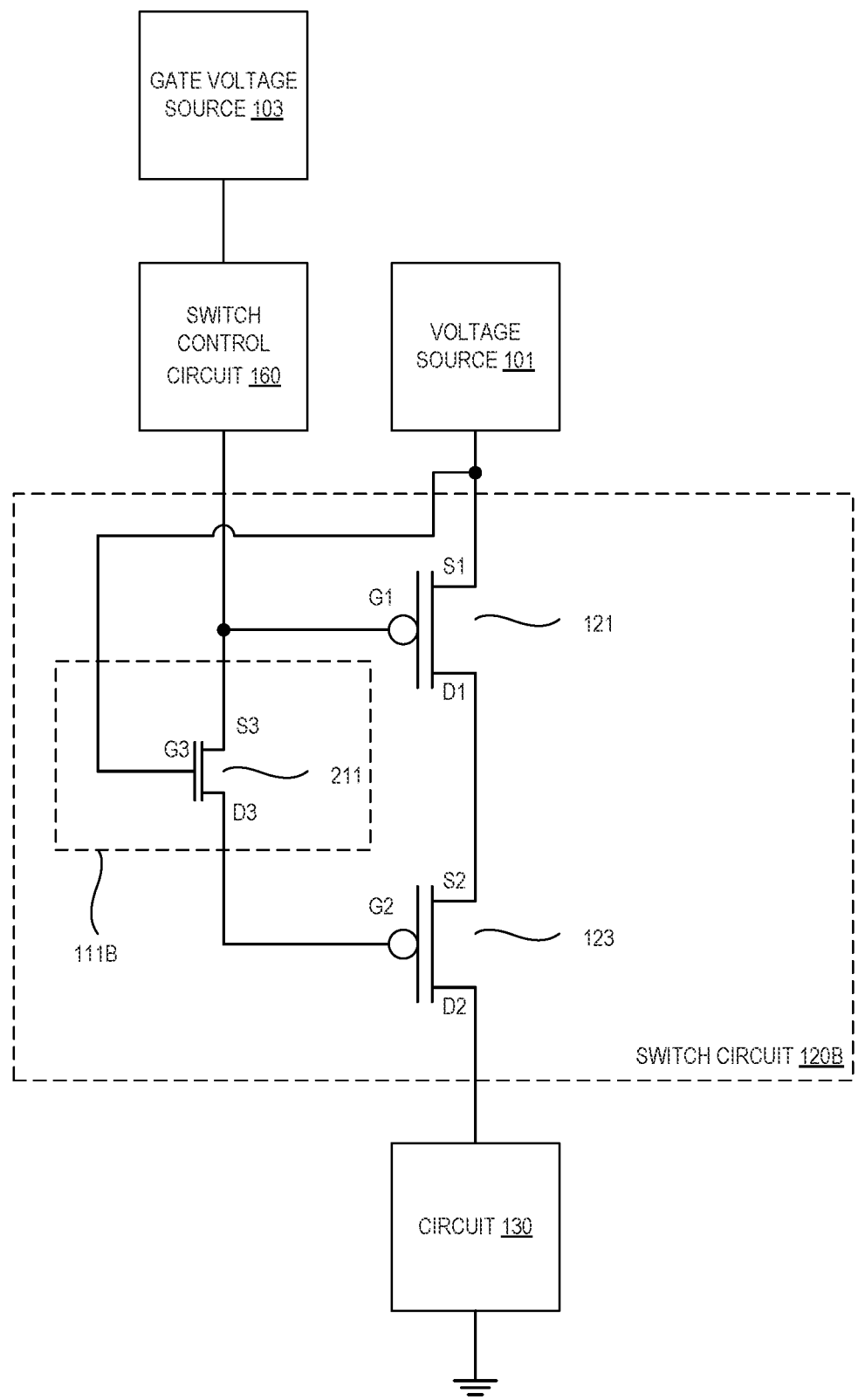
FIG. 2 illustrates a block diagram of an example switch circuit, in accordance with one or more embodiments of the present disclosure.

FIG. 2 illustrates a block diagram of an example switch circuit 120B, in accordance with one or more embodiments of the present disclosure. Switch circuits may be accomplished using a variety of circuit designs. As illustrated, switch circuit 120B includes gate circuit 111B, FET 121, and FET 123. Gate circuit 111B may be an example of gate circuit 111 illustrated in FIG. 1. Gate circuit 111B includes FET 211. In one embodiment, FET 121 and FET 123 may be p-channel MOSFETs (e.g., pFETs, pMOSFETs, PMOS transistors, etc.) and FET 211 may be a n-channel MOSFET (e.g., a nFET, a nMOSFET, a NMOS transistor, etc.). The switch circuit 120B may be in various states/conditions, such as an on state/condition (where current flows through the switch circuit 120B) and an off state/condition (where current does not flow through the switch circuit 120B). The state/condition of the switch circuit 120B (e.g., on/off state/condition) may be referred to as an activation state/condition.

The switch circuit 120B is coupled to voltage source 101, switch control circuit 160, and circuit 130 (e.g., an external circuit). The switch circuit 120B provides power (e.g., current and/or voltage) from the voltage source 101 to circuit 130, and circuit 130 may use the power to operate. The gate voltage source 103 may provide one or more voltages to the gates G1 and G2 (of FETs 121 and 123) via switch control circuit 160 and/or FET 211, as discussed in more detail below. Although voltage source 101 and gate voltage source 103 are illustrated in FIG. 2 as being separate from the switch circuit 120B, one or more of voltage source 101 and gate voltage source 103 may be part of the switch circuit 120B in other embodiments.

The source S1 of FET 121 is coupled to the voltage source 101. The drain D1 of FET 121 is coupled to the source S2 of FET 123. The drain D2 is coupled to the circuit 130. FETs 121 and 123 (e.g., a stack, a header stack, a header, etc.) may provide power from the voltage source 101 to the circuit 130. The FETs 121 and 123 may each have a threshold voltage (e.g., a voltage at which the FETs 121 and 123 may turn off). The voltage threshold of the of FET 121 may be higher than the voltage threshold of FET 123.

As discussed above, when the switch circuit 120B is in an off state/condition, a certain amount of current may still leak off through FETs 121 and 123. The leakage of current through FETs 121 and 123 may be reduced by applying a high/higher voltage level (e.g., a voltage level higher than the voltage threshold) at the gates G1 and G2 of the FETs 121 and 123. However, this may cause gate-induced drain leakage.

In one embodiment, the FET 211 may help reduce the amount of gate-induced drain leakage in the switch circuit 120B. When the switch circuit 120B is in an off state/condition, the gate G3 of the FET 211 receives a voltage from voltage source 101. This turns on the FET 211 (e.g., may allow current/voltage to pass through the FET 211). The source S3 of the FET 211 also receives a voltage from the gate voltage source 103 (via the switch control circuit 160). The voltage (from the gate voltage source 103) is also provided to gate G1 (of FET 121). As discussed above, the voltage at the gate G1 may be referred to as V1. The FET 211 may also provide the voltage received from the gate voltage source 103 (via switch control circuit 160) to gate G2 of (FET 123). For example, the voltage from the gate voltage source 103 may go through FET 211 to the gate G2. As the voltage goes through the FET 211, the voltage level of the voltage may be decreased, reduced, lowered, dropped, etc. This may result in a lower voltage level (e.g., V2) at the gate G2. The drop in the voltage level may be referred to as a voltage drop, a drop effect, etc. Thus, the FET 211 may cause a voltage with a lower voltage level V2 (than the voltage level V1 received from the switch control circuit 160) to be provided to the gate G2. Providing a voltage with a lower voltage level (e.g., V2) to the gate G2 of FET 123 and a voltage with a higher voltage level (e.g., V1) to the gate G1 of FET 121 may reduce the amount of gate-induced drain leakage (e.g., may reduce amount of current that leaks through FETs 121 and 123), as discussed above.

In one embodiment, the switch circuit 120B may be in an on state/condition. For example, the FETs 121 and 123 may be turned on to allow current to flow to the circuit 130. When the switch circuit 120B is in the on state/condition, the FET 211 may not affect the flow of the power/current to the circuit 130. For example, when the switch circuit 120B is the on state/condition, the gate voltage source 103 may provide a voltage of zero to FET 211 via the switch control circuit 160. As discussed above, the FET 211 may be a n-channel MOSFET. Generally, a n-channel MOSFET may be able to pass through a voltage with a voltage level of zero from S3 to D3. This allows the FET 211 to provide a voltage level of zero (e.g., 0V) to the gates G1 and G2. Providing a voltage level of zero to the gates G1 and G2 will cause the FETs 121 and 123 to allow power/current to flow to circuit 130 (e.g., providing a voltage level of zero to the gates G1 and G2 will turn the FETs 121 and 123 on). Thus, the FET 211 may have little to no effect on the flow of current through the switch circuit 120B when the switch circuit 120B is in the on state/condition.

In one embodiment, the switch control circuit 160 may control the operation of the switch circuit 120B (e.g., gate circuit 111B and/or FET 211). For example, when switch circuit 120B is in the off condition/state, the switch control circuit 160 may provide and/or may instruct/cause the gate voltage source 103 to provide a positive voltage to source S3. The positive voltage level may be dropped to a lower voltage level at drain D3 and provided to gate G2. In another example, when switch circuit 120B is in the on condition/state, the switch control circuit 160 may provide and/or may instruct/cause the gate voltage source 103 to provide a zero voltage level to source S3. The zero voltage level is provided to the gate G1 (by the switch control circuit 160) and to the gate G2 (via the FET 211), as discussed above.

The switch control circuit 160 may control the operation of the switch circuit 120B based on signals and/or instructions received from another device/circuit, as discussed above. Although the switch control circuit 160 is illustrated as separate from the switch circuit 120B, the switch control circuit 160 may be part of the switch circuit 120B in other embodiments.

Figure 3:
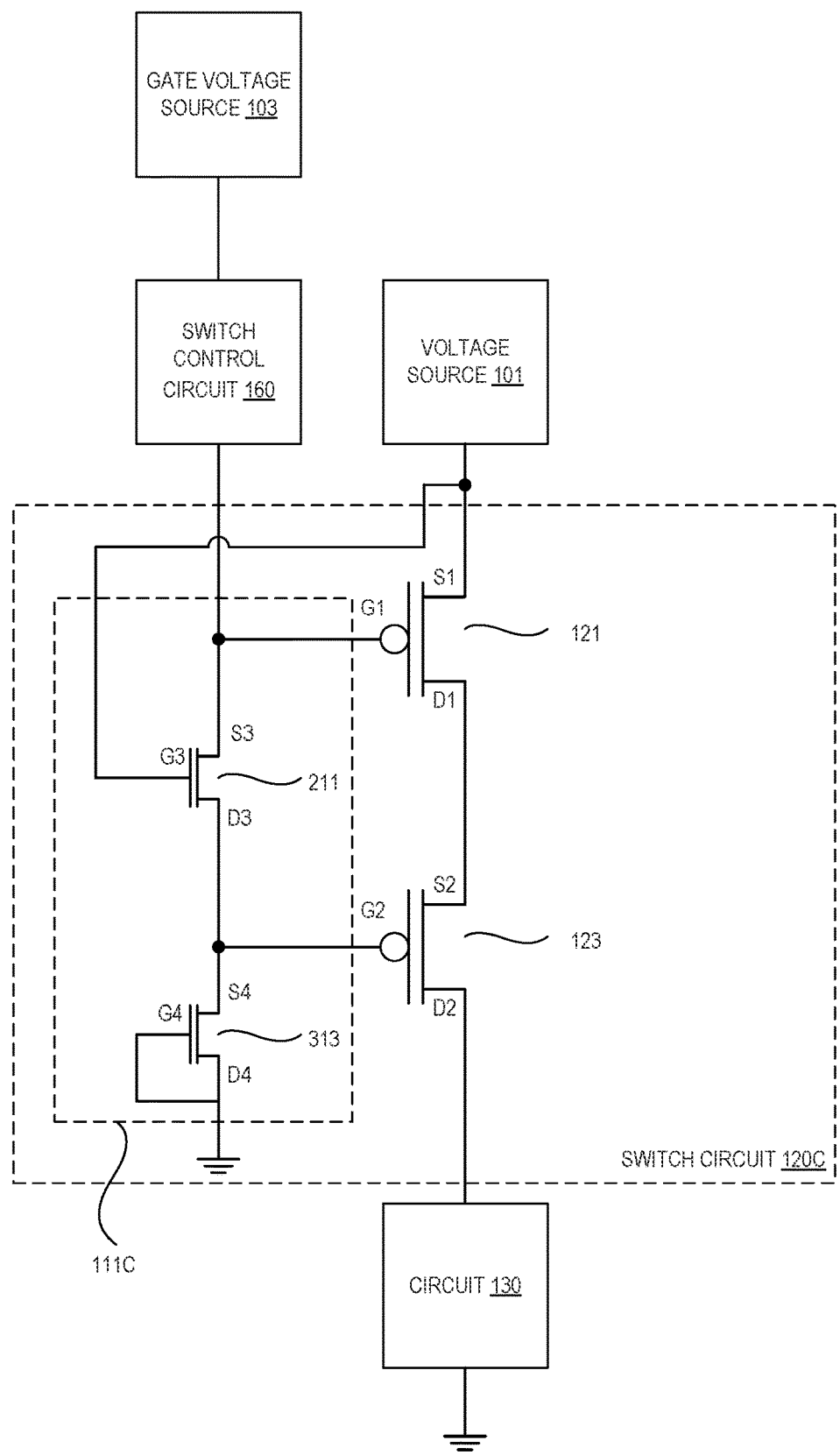
FIG. 3 illustrates a block diagram of an example switch circuit, in accordance with one or more embodiments of the present disclosure.

FIG. 3 illustrates a block diagram of an example switch circuit 120C, in accordance with one or more embodiments of the present disclosure. Switch circuits may be accomplished using a variety of circuit designs. As illustrated, switch circuit 120C includes gate circuit 111C, FET 121, and FET 123. Gate circuit 111C includes FET 313 and FET 211. Gate circuit 111C may be an example of gate circuit 111 illustrated in FIG. 1. In one embodiment, FETs 121 and 123 may be p-channel MOSFETs, and FETs 211 and 313 may be n-channel MOSFETs. The switch circuit 120C may be in various states/conditions, such as an on state/condition (where current flows through the switch circuit 120C) and an off state/condition (where current does not flow through the switch circuit 120C). The state/condition of the switch circuit 120C (e.g., on/off state/condition) may be referred to as an activation state/condition.

Switch circuit 120C includes many of the circuits, FETs, voltage sources, etc., that are illustrated in switch circuit 120B of FIG. 2. These same circuits, FETS, voltage source, etc., may operate and function as discussed above in conjunction with FIG. 2. For example, gate voltage source 103, voltage source 101, switch control circuit 160, FET 121, FET 123, and FET 211 may operate in the same or similar manner as discussed above in conjunction with FIG. 2.

As illustrated in FIG. 3, switch circuit 120C includes an additional FET 313 (when compared with switch circuit 120B illustrated in FIG. 2). The source S4 of the FET 313 is coupled to the drain D3 of the FET 211 and the drain D4 is coupled to a ground node. In one embodiment, FET 313 may be used to help current flow from gate voltage source 103 (via the switch control circuit 160) to the ground node. Helping the current flow through the FET 211 allows the gate circuit 111C to provide different voltages to the gates G1 and G2, as discussed above. For example, this may allow the FET 211 to provide voltages with the voltage level V1 (e.g., a higher voltage level) to gate G1 and voltage level V2 (e.g., a lower voltage level) to gate G2. As discussed above, providing a higher voltage level to gate G1 and a lower voltage level to gate G2 may reduce the amount of gate-induced drain leakage in the switch circuit 120C. FET 313 may be referred to as a pulldown, a pulldown FET, a pulldown circuit, etc.

In one embodiment, the switch control circuit 160 may control the operation of the switch circuit 120C based on signals and/or instructions received from another device/circuit. Although the switch control circuit 160 is illustrated as separate from the switch circuit 120C, the switch control circuit 160 may be part of the switch circuit 120C in other embodiments.

Figure 4:
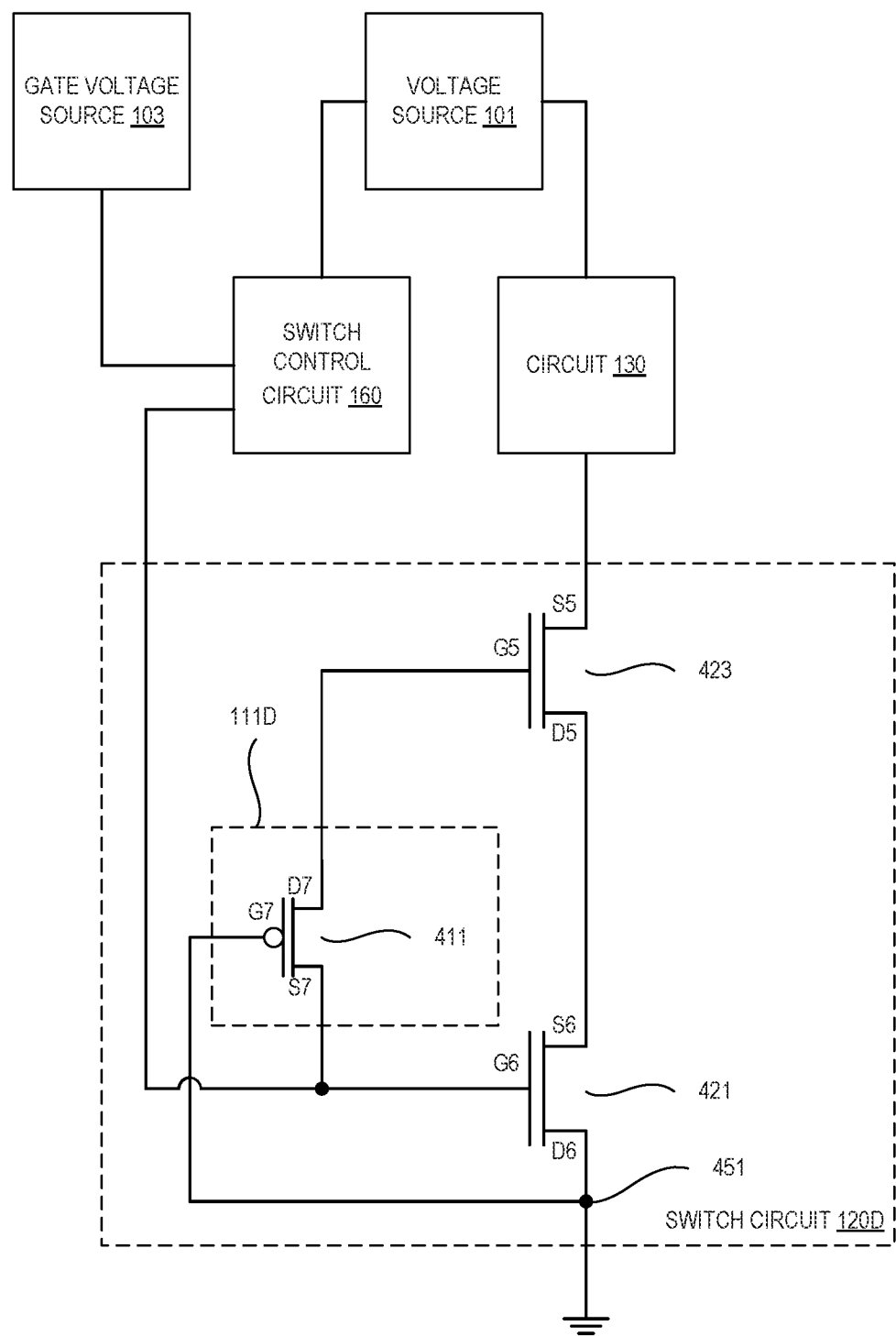
FIG. 4 illustrates a block diagram of an example switch circuit, in accordance with one or more embodiments of the present disclosure.

FIG. 4 illustrates a block diagram of an example switch circuit 120D, in accordance with one or more embodiments of the present disclosure. Switch circuits may be accomplished using a variety of circuit designs. As illustrated, switch circuit 120D includes gate circuit 111D, FET 421, and FET 423. Gate circuit 111D includes FET 411. Gate circuit 111D may be an example of gate circuit 111 illustrated in FIG. 1. In one embodiment, FETs 421 and 423 may be n-channel MOSFETs (e.g., nFETs, nMOSFETs, NMOS transistors, etc.) and FET 411 may be a p-channel MOSFET (e.g., a pFET, a pMOSFET, a PMOS transistor, etc.). The switch circuit 120D may be in various states/conditions, such as an on state/condition (where current flows through the switch circuit 120D) and an off state/condition (where current does not flow through the switch circuit 120D). The state/condition of the switch circuit 120D (e.g., on/off state/condition) may be referred to as an activation state/condition.

The switch circuit 120D is coupled to a switch control circuit 160 and a circuit 130 (e.g., an external circuit), and a ground node. As discussed above, the voltage source 101 may provide power to the circuit 130. The circuit 130 may use that power to operate (e.g., may use the current to power one or more portions of the circuit 130). The current (from voltage source 101) may also flow through circuit 130 to the switch circuit 120D. The switch circuit 120D may allow the current received from the circuit 130 to flow to the ground node. The voltage source 101 may also provide a voltage to the switch control circuit 160. For example, the voltage source 101 may provide a voltage with a positive voltage level to switch control circuit 160.

The source S5 of FET 423 is coupled to the circuit 130. The drain D5 of FET 423 is coupled to the source S6 of FET 421. The drain D6 of FET 421 is coupled to the ground node. FETs 421 and 423 may be referred to as a stack, a footer stack, a footer, etc., because they are located between the circuit 130 and the ground node. The FETs 421 and 423 may each have a threshold voltage level. The voltage threshold of the of FET 421 may be lower than the voltage threshold of FET 423.

As discussed above, when the switch circuit 120D is in an off state/condition, a certain amount of current may still leak through FETs 421 and 423. The leakage of current through FETs 421 and 423 may be reduced by applying a voltage at the gates G6 and G5 of the FETs 421 and 423 that is lower than the threshold voltage (e.g., by applying negative voltages or voltages lower than 0V). However, this may cause gate-induced drain leakage.

In one embodiment, the FET 411 may help reduce the amount of gate-induced drain leakage in the switch circuit 120D. When the switch circuit 120D is in an off state/condition, the switch control circuit 160 may receive a voltage from gate voltage source 103. The voltage from the gate voltage source 103 may have a negative voltage level (e.g., a voltage level less than 0V, such as −0.2V). The switch control circuit 160 may provide the voltage (from gate voltage source 103) to gate G6 of FET 421. The switch control circuit 160 also provides the voltage (from gate voltage source 103) to source S7 (of FET 411). The FET 411 may provide the voltage (received via the switch control circuit 160 from the gate voltage source 103) to gate G5 of (FET 423). For example, the voltage from the gate voltage source 103 may go through FET 411 to the gate G5. As the voltage goes or passes through the FET 411 at drain D7, the voltage level may increase resulting in another voltage with a higher voltage level at the gate G5 (e.g., a voltage level of 0.1V). Thus, the FET 411 may cause the higher voltage level to be provided to the gate G5. Providing a higher voltage level to the gate G5 of FET 423 and a lower voltage level to the gate G6 of FET 421 may reduce the amount of gate-induced drain leakage, as discussed above. When the switch circuit 120D is in an on state/condition, the switch control circuit 160 may receive a voltage with a positive/high voltage level (e.g., 0.5V) from voltage source 101, and may provide that voltage to the FET 411 and the gate G6. The voltage is also provided to the gate G5 via the FET 411. The positive/higher voltage level may turn on the FETs 421 and 423.

In one embodiment, the switch control circuit 160 may control the operation of the switch circuit 120D. For example, the switch control circuit 160 may provide different voltages to the gate circuit 111D (e.g., to FET 411), similar to as discussed above in conjunction with FIGS. 1-3. The switch control circuit 160 may control the operation of the switch circuit 120D based on signals and/or instructions received from another device/circuit. Although the switch control circuit 160 is illustrated as separate from the switch circuit 120D, the switch control circuit 160 may be part of the switch circuit 120D in other embodiments.

Figure 5:
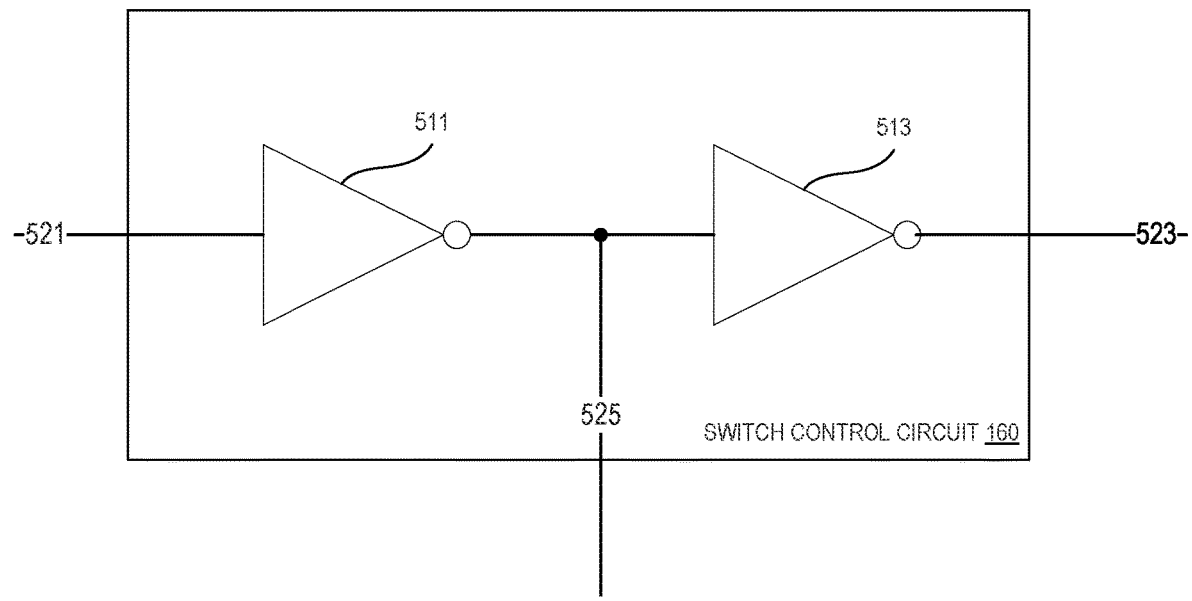
FIG. 5 illustrates a block diagram of an example switch control circuit, in accordance with one or more embodiments of the present disclosure.

FIG. 5 illustrates a block diagram of an example switch control circuit 160, in accordance with one or more embodiments of the present disclosure. As discussed above, the switch control circuit 160 may control or may help control the operation of a switch circuit, such as switch circuits 120A, 120B, 120C and 120D illustrated in FIGS. 1-4. The switch control circuit 160 includes an input 521, an output 523 and an output 525. The switch control circuit 160 also includes inverter 511 and inverter 513.

The switch control circuit 160 may receive a signal via input 521. The switch control circuit 160 may control the operation of a switch circuit based on the signal. For example, the signal may be a digital one or a high voltage indicating that the switch circuit should be turned on. In another example, the signal may be a digital zero or a lower voltage (e.g., a 0V) indicating that the switch circuit should be turned off. The switch control circuit 160 may be referred to as a digital circuit/device.

In one embodiment, the switch control circuit 160 receives a digital one or high voltage via input 521 when the switch circuit should be turned on. The digital one or high voltage is provided to inverter 511. The inverter 511 may invert the digital one or high voltage (e.g., invert the signal received via input 521) to a digital zero or low voltage. The inverted signal is provided to output 525. The inverted signal is also provided to inverter 513. The inverter 513 may invert the inverted signal back to a digital one or high voltage and may provide the digital one or high voltage to the output 523.

In one embodiment, the switch control circuit 160 receives a digital zero or low voltage via input 521 when the switch circuit should be turned off. The digital zero or low voltage is provided to inverter 511. The inverter 511 may invert the digital zero or low voltage (e.g., invert the signal received via input 521) to a digital one or high voltage. The inverted signal is provided to output 525. The inverted signal is also provided to inverter 513. The inverter 513 may invert the inverted signal back to a digital zero or low voltage and may provide the digital zero or low voltage to the output 523.

In one embodiment, output 525 may be coupled to a gate circuit of the switch circuit. For example, output 525 may be coupled to gate circuit 111, gate circuit 111B, gate circuit 111C, and/or gate circuit 111D, as illustrated in FIGS. 1-4. In particular, the output 525 may be coupled to a FET of a gate circuit. For example, the output 525 may be coupled to a source of FET 211 or a source of FET 411, as illustrated in FIGS. 2-4.

Although two p-channel MOSFETs (e.g., FETs 121 and 123) are illustrated in FIGS. 1-3, any number of p-channel MOSFETs may be used in a switch circuit. For example, three, five, or any other appropriate number of p-channel MOSFETs may be used in a switch circuit (e.g., may be coupled serially). In addition, additional n-channel MOSFETs may be used to provide voltages to the gates of the p-channel MOSFETs. Similarly, although two n-channel MOSFETs (e.g., FETs 421 and 423) are illustrated in FIG. 4, any number of n-channel MOSFETs may be used in a switch circuit, and additional p-channel MOSFETs may be used to provide voltages to the gates of the n-channel MOSFETs.

Although the FETs 121, 123, and 411 (e.g., pFETs) are illustrated with three terminals (e.g., gate, source, and drain), the FETs 121, 123, and 411 may also include a body terminal that is not illustrated in the figures. In some embodiments, the body terminal of the FETs 121, 123, and 411 is coupled to a voltage source (e.g., voltage source 101). Although the FETs 211, 313, 421, and 423 (e.g., nFETs) are illustrated with three terminals (e.g., gate, source, and drain), the FETs 211, 313, 421, and 423 may also include a body terminal that is not illustrated in the figures. In some embodiments, the body terminal of the FETs 211, 313, 421, and 423 is coupled to a ground node.

Structures such as those shown in FIGS. 1-5 for operating a switch circuit may be referred to using functional language. In some embodiments, these structures may be described as including "means for receiving a signal," "means for determining a switch circuit should be turned off," "means for providing a first voltage to a gate circuit," "means for generating a second voltage based on the first voltage," "means for providing the second voltage to a second gate of the second FET," "means for determining the switch circuit should be turned on," "means for providing a third voltage to the gate circuit," "means for providing the third voltage to the second gate of the second FET."

The corresponding structure for "means for receiving a signal" is switch control circuit 160 as well as equivalents of this circuit. The corresponding structure for "means for determining a switch circuit should be turned off" is switch control circuit 160 as well as equivalents of this circuit. The corresponding structure for "means for providing a first voltage to a gate circuit" is switch control circuit 160 as well as equivalents of this circuit. The corresponding structure for "means for generating a second voltage based on the first voltage" is gate circuit 111. The corresponding structure for "means for providing the second voltage to a second gate of the second FET" is gate circuit 111. The corresponding structure for "means for determining a switch circuit should be turned on" is switch control circuit 160 as well as equivalents of this circuit. The corresponding structure for "means providing a third voltage to the gate circuit" is gate circuit 111 as well as equivalents of this circuit. The corresponding structure for "means for providing a third voltage to the gate circuit" is gate circuit 111 as well as equivalents of this circuit. The corresponding structure for "means for providing the third voltage to the second gate of the second FET" gate circuit 111 as well as equivalents of this circuit.

Figure 6:
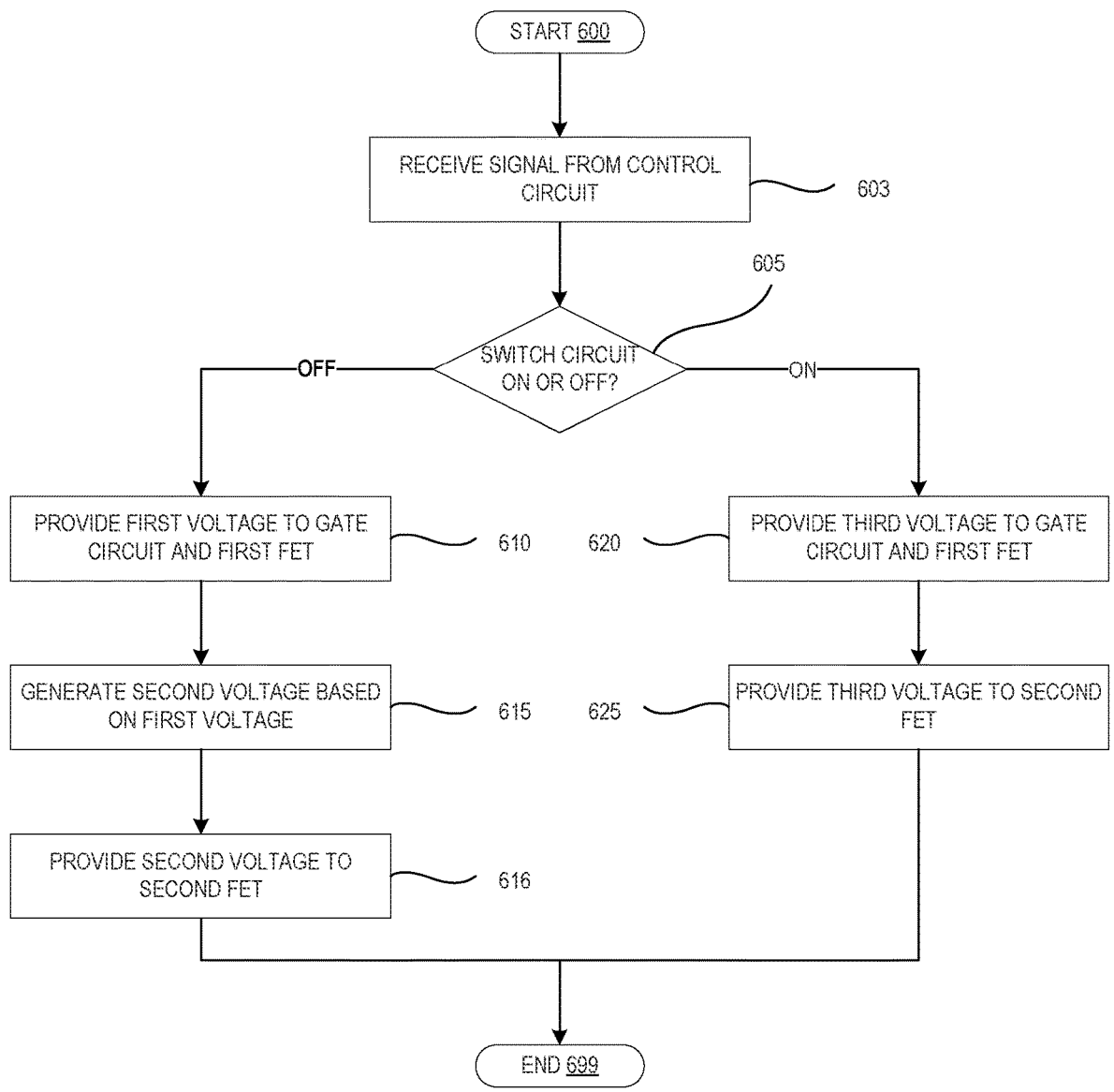
FIG. 6 illustrates a flow diagram depicting a method for operating a switch circuit, in accordance with one or more embodiments of the present disclosure.

FIG. 6 illustrates a flow diagram depicting a method for operating a switch circuit, in accordance with one or more embodiments of the present disclosure. The method, which may be applied to one or more of switch circuits 120A, 120B, 120C, and 120C depicted in FIGS. 1-4, starts at the block 600.

The method includes receiving a signal from a control circuit (e.g., a switch control circuit) to change an activation state of the switch circuit. The signal may include a first voltage at block 603. The method also includes determining whether the switch circuit should be turned on or turned off based on the signal at block 605.

If the switch circuit should be turned on, the method includes providing a first voltage to a gate circuit of the switch circuit at block 610. For example, the first voltage may be provided to an input of the gate circuit. The first voltage may have a first voltage level (e.g., a higher voltage level, V1 discussed above, etc.). The voltage may be received from the switch control circuit. The first voltage (with the first voltage level) may also be provided to a first FET of the switch circuit. For example, the first voltage may be provided to a first gate of the first FET. The gate circuit may generate a second voltage based on the first voltage at block 615. The second voltage may have a second voltage level (e.g., a lower voltage level, V2 as discussed above). For example, the gate circuit may be a gate FET and the first voltage level received at an input/source of the gate FET may be dropped to the second voltage level at an output/drain of the gate FET. The second voltage may also be generated based on another voltage received from a voltage source. For example, the gate circuit may use a voltage from voltage source 101 to generated the second voltage, as discussed above.

As discussed above, the first voltage may be provided to the first gate of the first FET. The second voltage (generated by the gate circuit) may be provided to a second FET of the switch circuit at block 616. For example, the second voltage may be provided to a second gate of the second FET. Providing the first and second voltages to the first and second gates may turn off the first and second FETs. Turning off the first and second FETs may prevent current from flowing through the first FET and the second FET. In addition, gate-induced drain leakage may be reduced because the first voltage level (of the first voltage) is higher than the second voltage level (of the second voltage). The method ends at block 699.

If the switch circuit should be turned on, the method further includes providing a third voltage to a gate circuit of the switch circuit at block 620. For example, the third voltage may be provided to an input of the gate circuit and the gate circuit may output the third voltage. The third voltage may have a third voltage level (e.g., 0V). The third voltage is also provided to the first FET. The method also includes providing the third voltage to the second FET at block 625 (e.g., to the second gate of the second FET). The third voltage may also be provided to the first FET (e.g., to the first gate of the first FET). Providing the third voltage to the first and second gates may turn on the first and second FETs. Turning on the first and second FETs may allow current to flow through the first FET and the second FET. The method ends at block 699.

Figure 7:
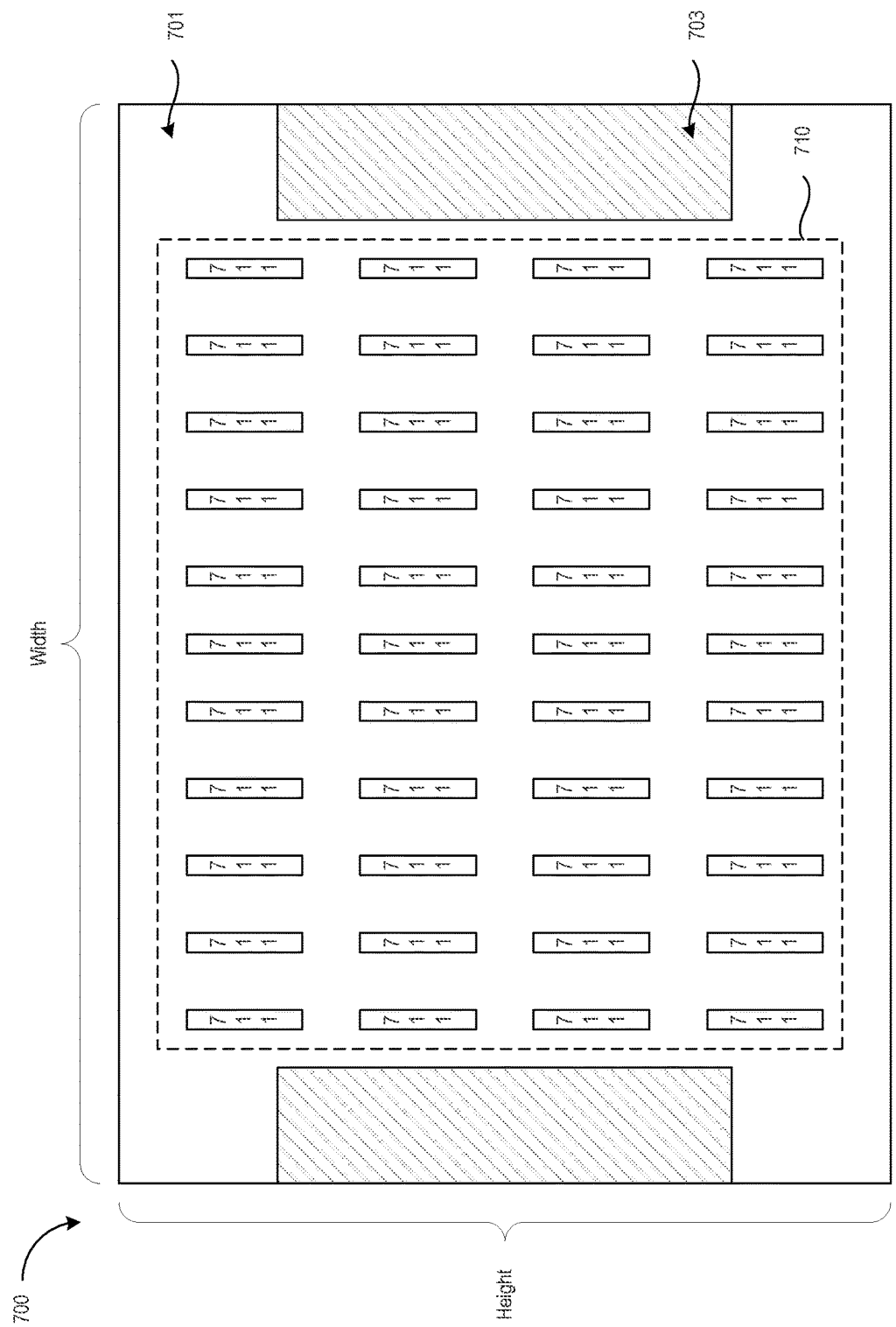
FIG. 7 illustrates an example metal-oxide-semiconductor (MOS) structure, in accordance with one or more embodiments of the present disclosure.

FIG. 7 illustrates an example metal-oxide-semiconductor (MOS) structure 700, in accordance with one or more embodiments of the present disclosure. The MOS structure 700 has a height, width, and a length (not illustrated in FIG. 7). The MOS structure 700 includes two regions, a n-Well region 701 (e.g., a non-shaded region) and a p-Well region 703 (e.g., a shaded region). The n-Well region 701 may be referred to as a nWell, a nWell region, etc. The p-Well region 703 may be referred to as a pWell, a pWell region, etc. The MOS structure 700 may be referred to as a cell, a switch cell, a FET cell, etc.

The MOS structure 700 also includes a switch circuit 710. In one embodiment, the switch circuit 710 may be a p-channel FET (e.g., a PMOS, a pFET, etc.). As illustrated in FIG. 7, the p-channel MOSFET uses a majority of the n-Well region 701. The switch circuit 710 may also be a fin field-effect transistor (e.g., a FinFET, a fin FET, etc.). The fin FET may include multiple fins 711.

Figure 8:
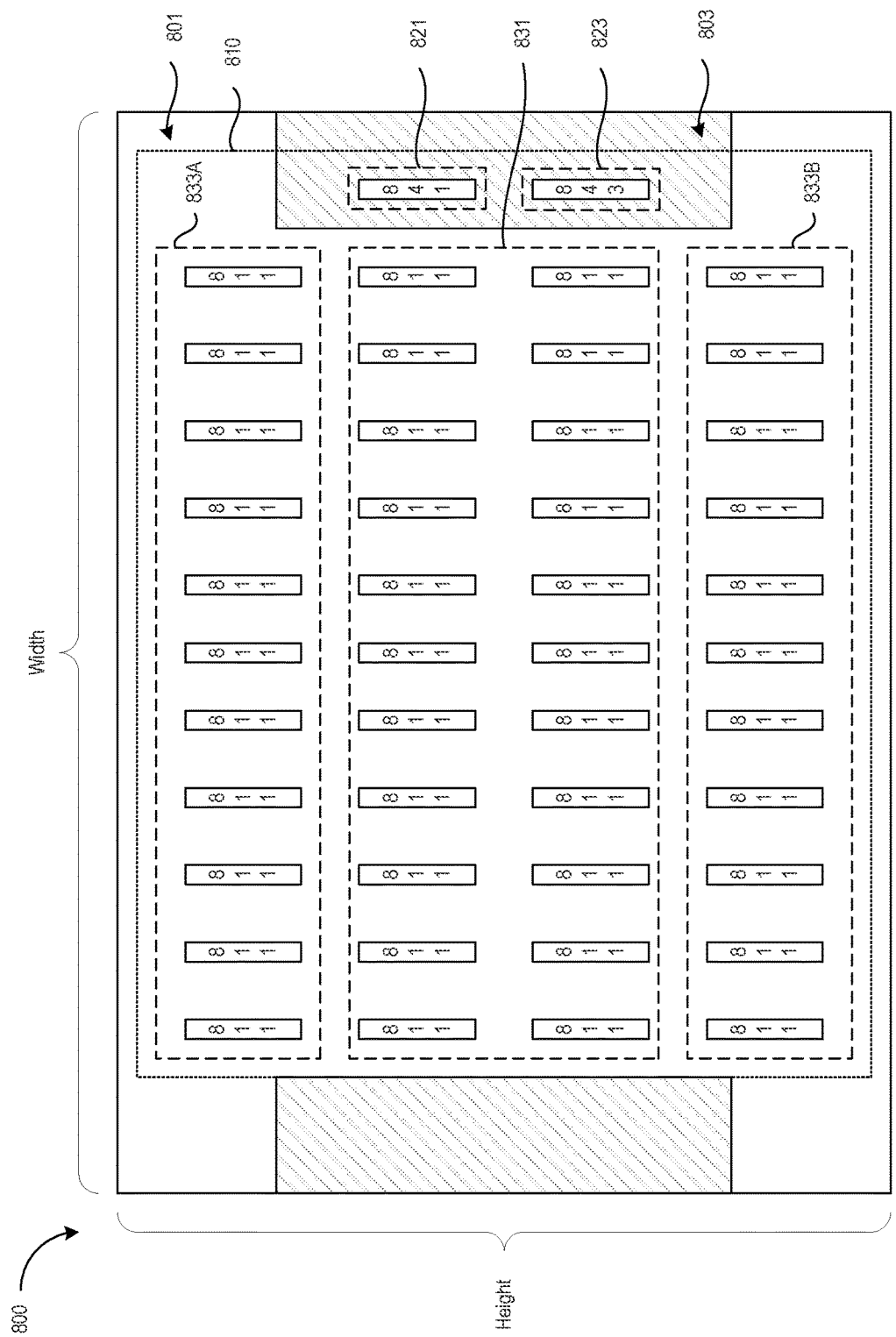
FIG. 8 illustrates an example metal-oxide-semiconductor (MOS) structure, in accordance with one or more embodiments of the present disclosure.

FIG. 8 illustrates an example metal-oxide-semiconductor (MOS) structure 800, in accordance with one or more embodiments of the present disclosure. The MOS structure 800 (e.g., a cell, switch cell, FET cell, etc.) has a height, width, and a length (not illustrated in FIG. 8). The MOS structure 800 includes two regions, a n-Well region 801 (e.g., a non-shaded region) and a p-Well region 803 (e.g., a shaded region). The n-Well region 801 may be referred to as a nWell, a nWell region, etc. The p-Well region 803 may be referred to as a pWell, a pWell region, etc. The MOS structure 800 includes a switch circuit 810.

In one embodiment, the switch circuit 810 includes FETs 831 and 833. FETs 831 and 833 may be p-channel FETs. FET 833 includes two parts 833A and 833B. The two parts 833A and 833B may be collectively referred to as FET 833. FET 831 may be an example of FETs 121 (illustrated in FIGS. 1-3), and FET 833 may be an example of FET 123 (illustrated in FIGS. 1-3).

The switch circuit 810 also include FET 821. The FET 821 may be an n-channel FET. FET 821 may be an example of FET 211 (illustrated in FIGS. 1-3). The switch circuit 810 may also include optional FET 823 (e.g., a pulldown, a pulldown FET, etc.). The FET 823 may also be an n-channel FET. FET 823 may be an example of FET 313 (illustrated in FIG. 3). In one embodiment, the FETs 821 and/or 823 are smaller than FETs 831 and 833. For example, FETs 821 and/or 823 include fewer fins than FETs 831 and 833. This may allow FETs 821 and/or 823 to be added to a MOS structure without changing or with few changes to the size of the MOS structure.

In one embodiment, the switch circuit 810 may also be a fin FET. The fin FET may include multiple fins 811, 841, and 843. The number, locations, and/or shapes of the fins 811, 841, and 843 illustrated in FIG. 8 are merely examples. In other embodiments, a different number of fins, different locations for the fins, and different shapes for the fins may be used.

As illustrated in FIG. 8, the MOS structure 800 may have the same height, width, and length as the MOS structure 700 illustrated in FIG. 7. However, rather than using the p-Well region 803 for a single FET (e.g., a single pFET), the p-Well region 803 is divided to allow for multiple FETs (e.g., FETs 833 and 831) to fit within the p-Well region 803. Because the switch circuit 810 is implemented using the same size MOS structure (e.g., the same size cell) as illustrated in FIG. 7, the switch circuit 810 may be used in devices that use the same size as MOS structure 700 illustrated in FIG. 7, without changing the footprint, layout, configuration, etc., of other circuits.

Figure 9:
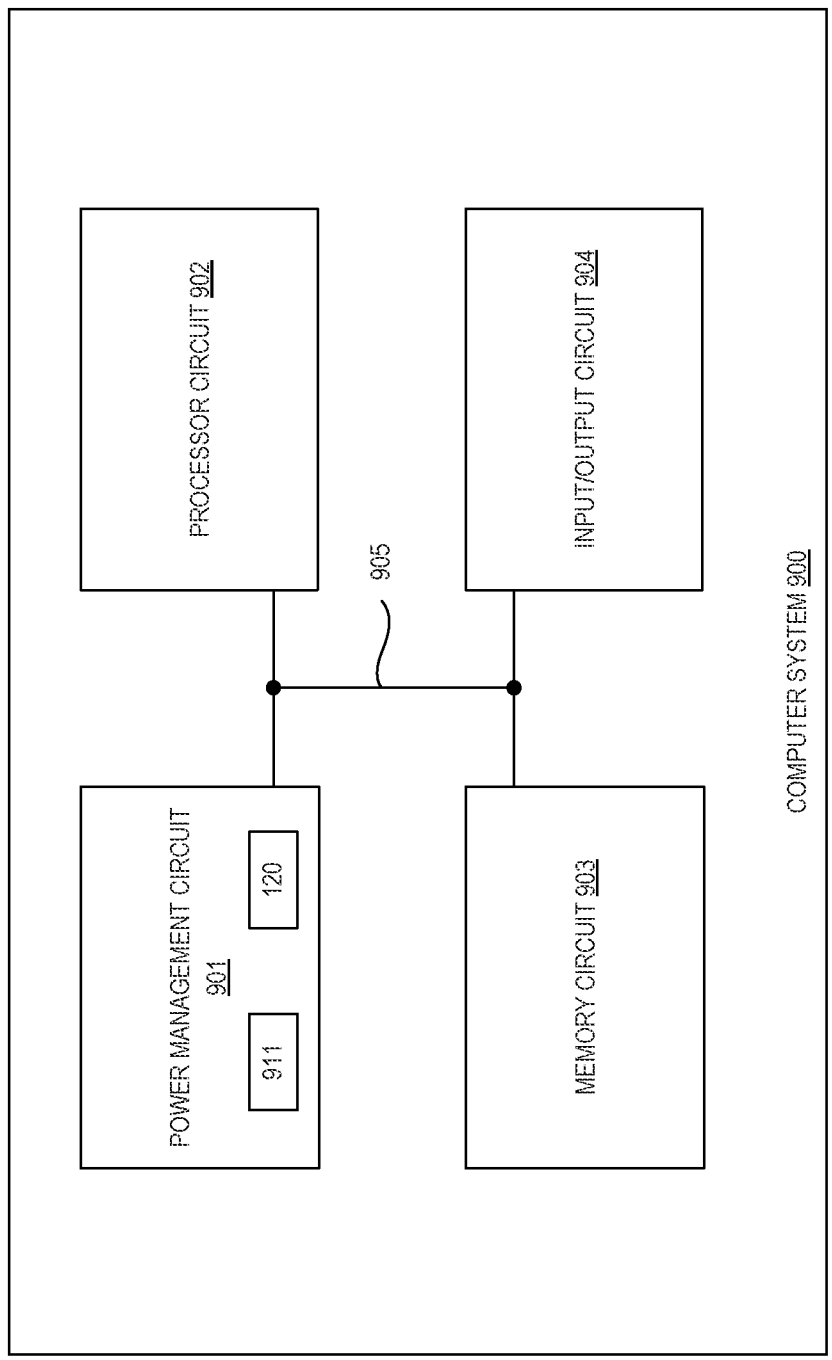
FIG. 9 illustrates a block diagram of an example computer system, in accordance with one or more embodiments of the present disclosure.

FIG. 9 illustrates a block diagram of an example computer system 900, in accordance with one or more embodiments of the present disclosure. As illustrated in FIG. 9, the computer system 900 includes power management circuit 901, processor circuit 902, memory circuit 903, and input/output circuits 904, each of which is coupled to power supply signal 905. In various embodiments, computer system 900 may be a system-on-a-chip (SoC) and/or be configured for use in a desktop computer, server, or in a mobile computing application such as, e.g., a tablet, laptop computer, or wearable computing device.

Power management circuit 901 includes power converter circuit 911, which is configured to generate a regulated voltage level on power supply signal 905 in order to provide power to processor circuit 902, memory circuit 903, and input/output circuits 904. The power management circuit 901 also includes switch circuit 120. Although power management circuit 901 is depicted as including a single power converter circuit, in other embodiments, any suitable number of power converter circuits may be included in power management circuit 901, each configured to generate a regulated voltage level on a respective one of multiple internal power supply signals included in computer system 900. In cases where multiple power converter circuits are employed, two or more of the multiple power converter circuits may be connected to a common set of power terminals that connections to power supply signals and ground supply signals of computer system 900.

Processor circuit 902 may, in various embodiments, be representative of a general-purpose processor that performs computational operations. For example, processor circuit 902 may be a central processing unit (CPU) such as a microprocessor, a microcontroller, an application-specific integrated circuit (ASIC), or a field-programmable gate array (FPGA).

Memory circuit 903 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 9, in other embodiments, any suitable number of memory circuits may be employed.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol, IEEE 1394 (Firewire®) protocol, peripheral component interconnect (PCI) or PCI Express (PCIe).

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a first transistor comprising a first gate, a first source, and a first drain;
a second transistor comprising a second gate, a second source, and a second drain, wherein the first transistor and the second transistor are coupled between a power supply node and a circuit block; and
a gate circuit coupled to the first gate and the second gate, wherein the gate circuit is configured to generate a gate control voltage on the second gate using a switch control voltage coupled to the first gate, wherein the gate control voltage is lower than the switch control voltage, wherein the gate circuit includes a third transistor coupled between the first gate and the second gate, and a fourth transistor coupled between the second gate and a ground node, wherein the third transistor is configured to couple, using a voltage level of the power supply node, the first gate to the second gate, and wherein a fourth gate of the fourth transistor is coupled to the ground node.

2. The apparatus of claim 1, wherein to couple the first gate to the second gate, the third transistor is further configured to reduce the switch control voltage to generate the gate control voltage.

3. The apparatus of claim 1, wherein the first transistor and the second transistor comprise p-channel metal-oxide-semiconductor field-effect transistors, and wherein the third transistor comprises an n-channel metal-oxide-semiconductor field-effect transistor.

4. The apparatus of claim 3, wherein the first source is coupled to the power supply node, wherein the first drain is coupled to the second source, and wherein the second drain is coupled to the circuit block.

5. The apparatus of claim 1, wherein the first transistor and the second transistor comprise n-channel metal-oxide-semiconductor field-effect transistors, and wherein the gate circuit includes a p-channel metal-oxide-semiconductor field-effect transistor coupled between the first gate and the second gate, wherein the first transistor and the second transistor are coupled between the circuit block and the ground node.

6. The apparatus of claim 5, wherein the first source is coupled to the circuit block, wherein the first drain is coupled to the second source, and wherein the second drain is coupled to the ground node.

7. The apparatus of claim 5, wherein a fourth gate of the p-channel metal-oxide-semiconductor field-effect transistor is coupled to the ground node.

8. The apparatus of claim 1, wherein a first threshold voltage of the first transistor is different from a second threshold voltage of the second transistor.

9. The apparatus of claim 1, wherein the first transistor and the second transistor are configured to couple the circuit block to the power supply node in response to a first determination that the switch control voltage is a first value.

10. The apparatus of claim 9, wherein the first transistor and the second transistor are configured to de-couple the circuit block from the power supply node in response to a second determination that the switch control voltage is a second value different than the first value.

11. The apparatus of claim 1, wherein a third gate of the third transistor is coupled to the power supply node.

12. A method, comprising:
receiving, by a switch circuit, a signal from a control circuit to change an activation state of the switch circuit, the signal including a first voltage having a first voltage level, wherein the switch circuit includes a first transistor and a second transistor coupled between a power supply node and an external circuit;
generating, by the switch circuit, a second voltage having a second voltage level less than the first voltage, wherein the switch circuit includes:
a third transistor coupled between a first gate of the first transistor and a second gate of the second transistor; and
a fourth transistor coupled between the second gate and a ground node, and wherein a fourth gate of the fourth transistor is coupled to the ground node;
coupling, by the third transistor using a voltage level of the power supply node, the first gate to the second gate; and
providing the second voltage to the second gate of the second transistor.

13. The method of claim 12, further comprising, in response to determining the switch circuit is being turned on, providing a third voltage to the second gate of the second transistor.

14. The method of claim 13, wherein the first voltage is also provided to the first gate of the first transistor.

15. The method of claim 12, wherein a first threshold voltage of the first transistor is different from a second threshold voltage of the second transistor.

16. The method of claim 12, wherein the first transistor and the second transistor comprise p-channel metal-oxide semiconductor field-effect transistors.

17. A system, comprising:
a power management circuit configured to generate a supply voltage on a power supply node;
a switch circuit coupled between the power supply node and a circuit block; and
a control circuit configured to provide a control signal that includes one or more voltages; and
wherein the switch circuit includes a first transistor, a second transistor, a third transistor coupled between a first gate of the first transistor and a second gate of the second transistor, and a fourth transistor coupled between the second gate and a ground node, wherein a fourth gate of the fourth transistor is coupled to the ground node, and wherein the switch circuit is configured to:
receive the control signal;
generate a second voltage using a first voltage of the control signal, wherein the second voltage is less than the first voltage;
couple, using the third transistor and the supply voltage, the first gate to the second gate; and
provide the second voltage to a second gate of the second transistor.

18. The system of claim 17, wherein the switch circuit is further configured to de-couple the circuit block from the power supply node in response to a determination that the control signal is at the first voltage.

19. The system of claim 17, wherein the switch circuit is further configured to couple the circuit block to the power supply node in response to a determination that the control signal is at a third voltage different that than the first voltage.

20. The system of claim 17, wherein a first threshold voltage of the first transistor is different from a second threshold voltage of the second transistor.

* * * * *